United States Patent
Kim et al.

(10) Patent No.: US 9,240,509 B2
(45) Date of Patent: Jan. 19, 2016

(54) SOLAR CELL INCLUDING MICROLENS AND METHOD OF FABRICATING THE SAME

(75) Inventors: Jae-Hyun Kim, Paju-si (KR); Seong-Kee Park, Goyang-si (KR); Jung-shik Lim, Seoul (KR); Tae-Young Lee, Paju-si (KR); Min-Cheol Kim, Icheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 1086 days.

(21) Appl. No.: 13/090,817

(22) Filed: Apr. 20, 2011

(65) Prior Publication Data

US 2011/0259407 A1    Oct. 27, 2011

(30) Foreign Application Priority Data

Apr. 27, 2010  (KR) ................ 10-2010-0039076

(51) Int. Cl.
| | |
|---|---|
| *H01L 31/00* | (2006.01) |
| *H01L 31/054* | (2014.01) |
| *H02S 40/22* | (2014.01) |
| *G02B 3/00* | (2006.01) |
| *H01L 31/075* | (2012.01) |
| *H01L 31/056* | (2014.01) |

(52) U.S. Cl.
CPC .......... *H01L 31/0543* (2014.12); *G02B 3/0056* (2013.01); *H02S 40/22* (2014.12); *H01L 31/056* (2014.12); *H01L 31/075* (2013.01); *Y02E 10/52* (2013.01); *Y02E 10/548* (2013.01)

(58) Field of Classification Search
CPC ............ H01L 31/0522; H01L 31/05224; H01L 31/0524; H01L 31/0543; H01L 31/0075; Y02E 10/52; Y02E 10/50; H02S 40/22; G02B 3/0056

USPC .................................................. 136/259, 246
See application file for complete search history.

(56) References Cited

U.S. PATENT DOCUMENTS

| | | | |
|---|---|---|---|
| 4,571,448 A * | 2/1986 | Barnett ..................... | 136/259 |
| 6,420,647 B1 | 7/2002 | Ji et al. | |
| 2003/0015234 A1 * | 1/2003 | Yasuno ..................... | 136/249 |
| 2006/0007552 A1 * | 1/2006 | Takakuwa et al. .......... | 359/619 |
| 2007/0217019 A1 * | 9/2007 | Huang et al. ............... | 359/642 |
| 2008/0007836 A1 * | 1/2008 | Lu ....................... | G02B 3/0012 |
| | | | 359/619 |
| 2010/0307553 A1 * | 12/2010 | Defries et al. ............. | 136/243 |
| 2011/0192445 A1 * | 8/2011 | Solzbacher ........... | H01L 31/048 |
| | | | 136/246 |

FOREIGN PATENT DOCUMENTS

| | | |
|---|---|---|
| CN | 1193194 | 9/1998 |
| CN | 101038347 | 9/2007 |

* cited by examiner

*Primary Examiner* — Allison Bourke
(74) *Attorney, Agent, or Firm* — Dentons US LLP

(57) ABSTRACT

Disclosed is a method of fabricating a microlens. The method includes forming a self assembly monolayer having a strong hydrophobicity on a substrate; forming a plurality of ink droplets on the self assembly monolayer by jetting a transparent ink using an inkjet apparatus, the transparent ink including a first solvent having a first boiling point, a second solvent having a second boiling point lower than the first boiling point and a silicon oxide (SiOx) solid material dispersed in the first and second solvents; and drying the plurality of ink droplets.

7 Claims, 6 Drawing Sheets arrangement of microlenses posterior to hardening step

SOLAR CELL INCLUDING MICROLENS AND METHOD OF FABRICATING THE SAME

This application claims the benefit of Korean Patent Application No. 10-2010-0039076, filed on Apr. 27, 2010, which is hereby incorporated by reference in its entirety.

BACKGROUND OF THE INVENTION

1. Field of the Invention

The present invention relates to a solar cell, and more particularly, to a solar cell including a microlens for improving light capture property and a method of fabricating the solar cell.

2. Discussion of the Related Art

In general, a solar cell, which is a semiconductor device converting a solar energy into an electric energy, includes a junction of a positive (P) type semiconductor and a negative (N) type semiconductor and has the same basic structure as a diode. Most typical solar cells have a structure of a positive-negative (PN) junction semiconductor layer where a P type semiconductor layer and an N type semiconductor layer between facing two electrodes.

For the purpose of improving photoelectric efficiency, the solar cell includes a light collecting means that concentrates the light of the sun and irradiates the light onto the surface of the solar cell. For example, the light collecting means is a microlens.

The microlens is fabricated through various methods such as an etching method using a laser pulse, a reflow method using a photoresist, a dry etching method, a glass surface processing method using carbon dioxide ($CO_2$) laser, a method using a surface tension of a liquefied glass, an ion beam processing method for a polymer by a laser deposition, an inkjet method, a heating method for a photoresist, a gray scale masking method and an embossing molding method.

FIGS. 1A to 1C are cross-sectional views showing a reflow method using a photoresist of fabricating a microlens according to the related art. In FIG. 1A, a resin layer 20 for a microlens is formed on a substrate 10 and a photo mask 90 is disposed over the resin layer 20. The resin layer 20 is patterned through a photolithographic process including exposure and development steps to become a resin pattern 25 corresponding to a curved surface of a lens as shown in FIG. 1B. In FIG. 1C, the resin pattern 25 (of FIG. 1B) is heated and reflows in a heat treatment apparatus to become a microlens 30.

However, the method of fabricating a microlens according to the related art is performed through a photolithographic process in which a plurality of steps such as a photoresist coating step, an exposure step and a development step are required. Specifically, the exposure step requires an expensive photo mask and an expensive exposure apparatus. As a result, a microlens according to the related art is fabricated through complicated steps with a high fabrication cost.

SUMMARY OF THE INVENTION

Accordingly, the present invention is directed to a solar cell including a microlens and a method of fabricating the solar cell that substantially obviate one or more of the problems due to limitations and disadvantages of the related art.

An advantage of the present invention is to provide a method of fabricating a solar cell including a microlens where the microlens is simply and accurately formed and a fabrication time and a fabrication cost are reduced.

Another advantage of the present invention is to provide a solar cell including a microlens as a light collecting means where a light collecting efficiency is improved and a fabrication cost is reduced.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a solar cell including: a substrate; a first transparent electrode on the substrate; a first positive-intrinsic-negative (PIN) junction semiconductor layer on the first transparent electrode, wherein the first PIN junction semiconductor layer includes a negative (N) type semiconductor layer on the first transparent electrode, an intrinsic semiconductor layer on the N type semiconductor layer and a positive (P) type semiconductor layer on the intrinsic semiconductor layer, and wherein the N type and P type semiconductor layers include silicon doped with N type and P type impurities, respectively, and the intrinsic semiconductor layer includes hydrogenated silicon; a second transparent electrode on the first PIN junction semiconductor layer; and a light collecting means on the second transparent electrode, wherein the light collecting means includes a self assembly monolayer having a strong hydrophobicity and a plurality of microlenses having a hydrophilicity on the self assembly monolayer.

In another aspect, a method of fabricating a solar cell includes: forming a first transparent electrode on a first substrate; forming a first self assembly monolayer having a strong hydrophobicity on a substrate; forming a first positive-intrinsic-negative (PIN) junction semiconductor layer on the first transparent electrode, wherein the first PIN junction semiconductor layer includes a negative (N) type semiconductor layer on the first transparent electrode, an intrinsic semiconductor layer on the N type semiconductor layer and a positive (P) type semiconductor layer on the intrinsic semiconductor layer, and wherein the N type and P type semiconductor layers include silicon doped with N type and P type impurities, respectively, and the intrinsic semiconductor layer includes hydrogenated silicon; forming a second transparent electrode on the first PIN junction semiconductor layer; and forming a light collecting means on the second transparent electrode, wherein the light collecting means includes a second substrate, a self assembly monolayer having a strong hydrophobicity on the second substrate and a plurality of microlenses having a hydrophilicity on the self assembly monolayer.

In another aspect, a method of fabricating a microlens includes: forming a self assembly monolayer having a strong hydrophobicity on a substrate; forming a plurality of ink droplets on the self assembly monolayer by jetting a transparent ink having a hydrophilicity, the transparent ink including a first solvent having a first boiling point, a second solvent having a second boiling point lower than the first boiling point and a silicon oxide (SiOx) solid material dispersed in the first and second solvents; and drying the plurality of ink droplets.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

Figure 1A:
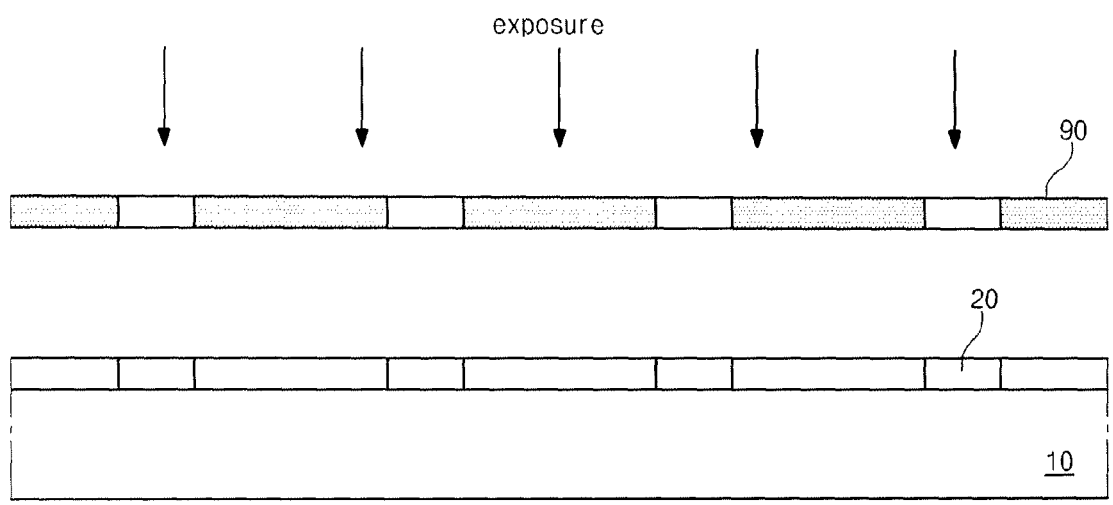
FIGS. 1A to 1C are cross-sectional views showing a reflow method using a photoresist of fabricating a microlens according to the related art.
Figure 1B:
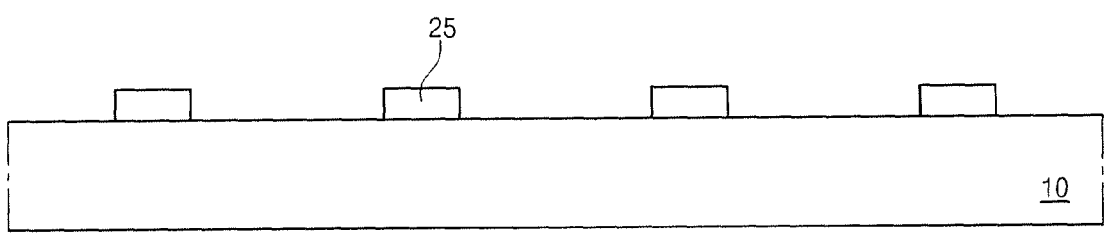
Figure 1C:
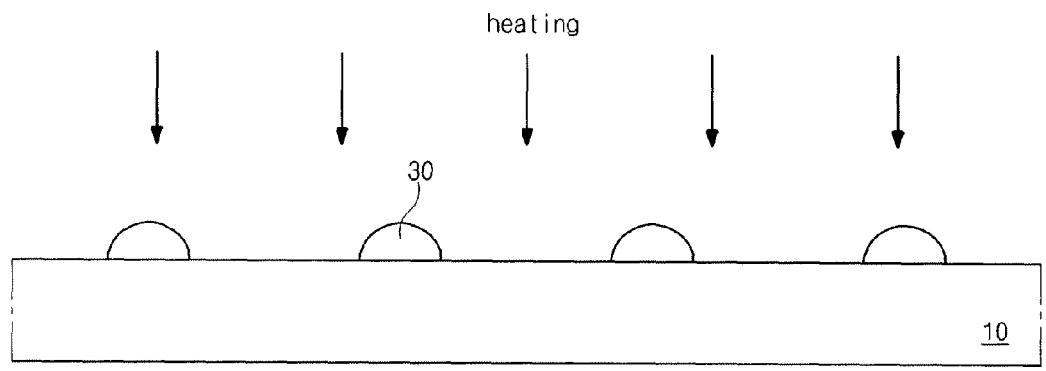
Figure 2A:
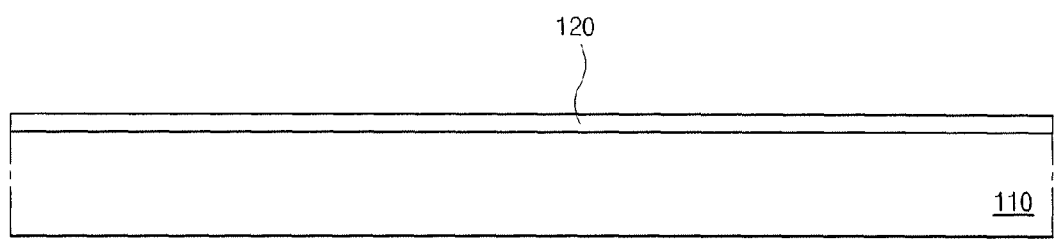
FIGS. 2A to 2C are cross-sectional views showing a method of fabricating a microlens according to an embodiment of the present invention.
Figure 2B:
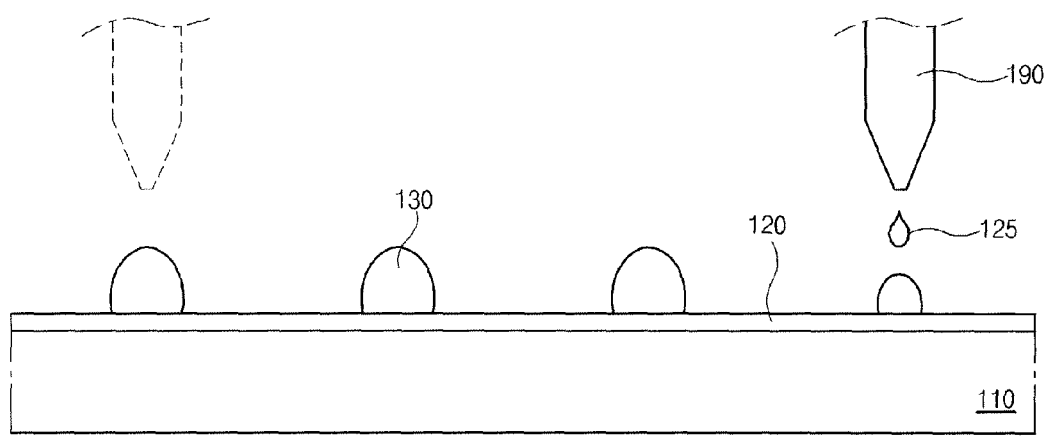
Figure 2C:
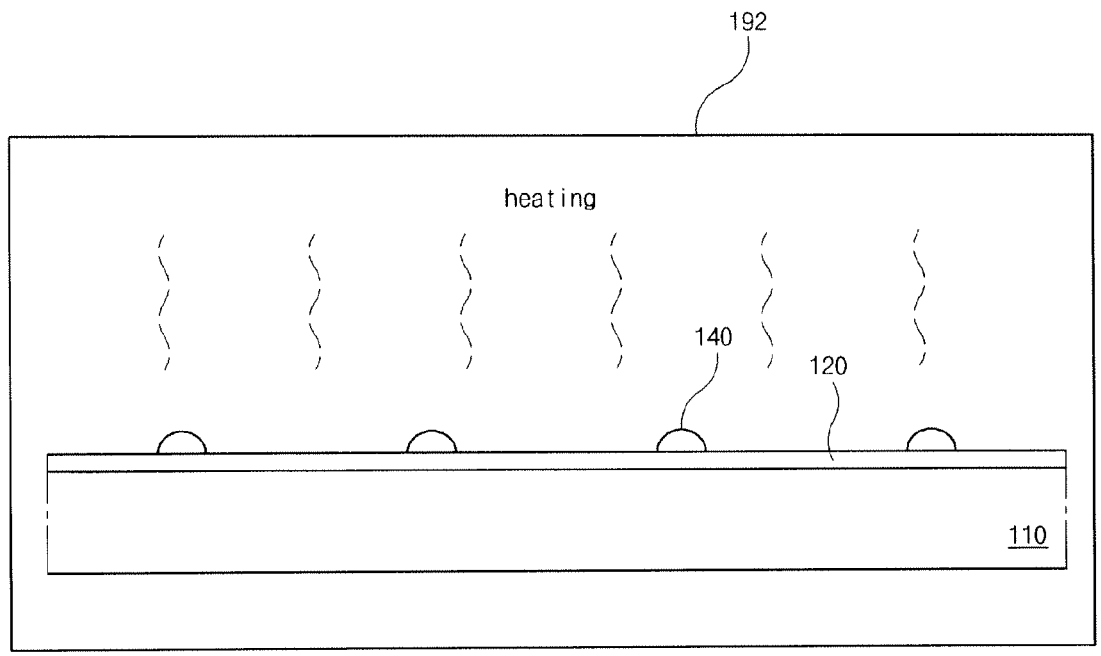
Figure 3:
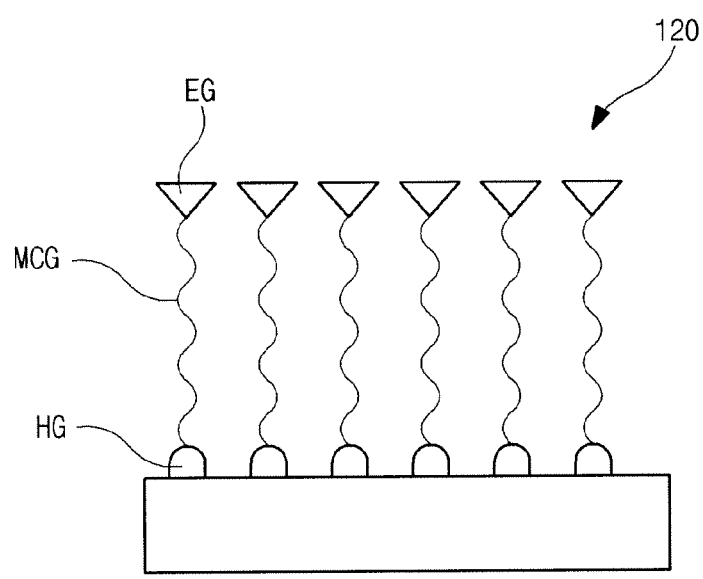
FIG. 3 is a view showing a basic structure of a self assembly monolayer for a microlens according an embodiment of the present invention.
Figure 4:
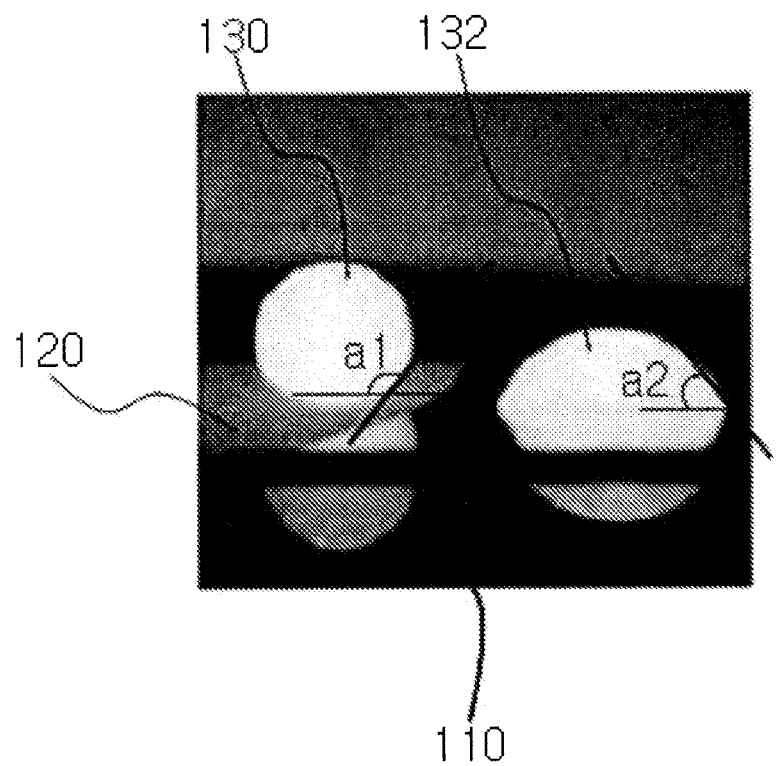
FIG. 4 is a picture showing an ink droplet for a microlens according to an embodiment of the present invention.
Figure 5:
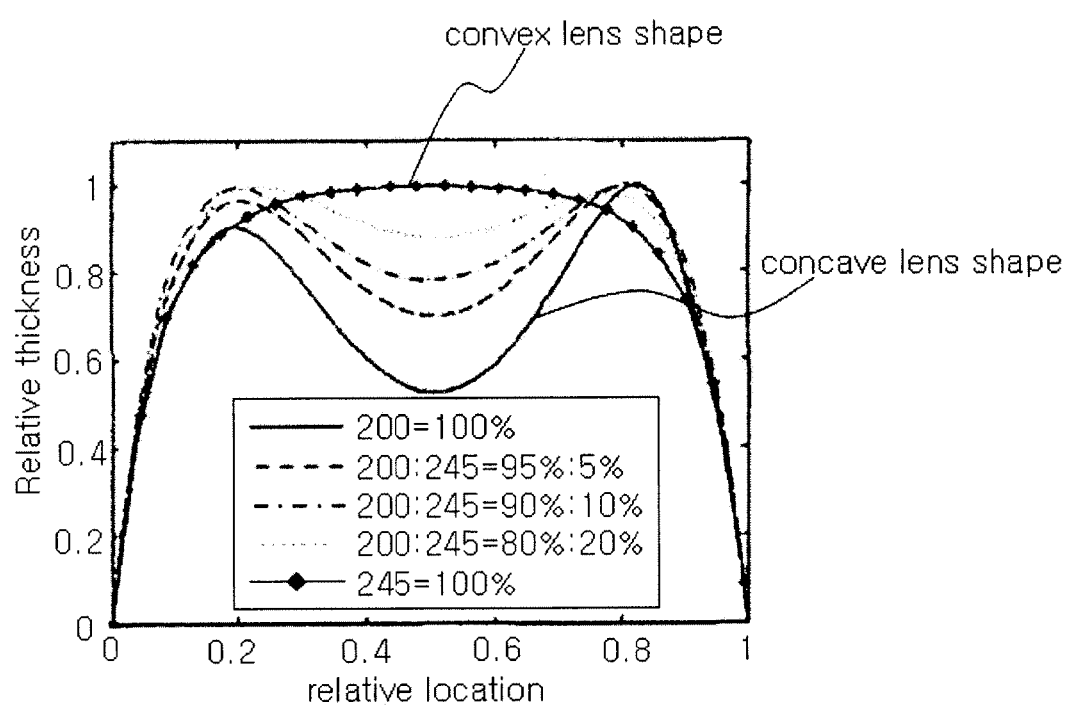
FIG. 5 is a graph showing a cross-sectional profile posterior to a drying step of an ink droplet including first and second solvents having first and second boiling points, respectively, different from each other for a microlens according to an embodiment of the present invention.

FIGS. 2A to 2C are cross-sectional views showing a method of fabricating a microlens according to an embodiment of the present invention, and FIG. 3 is a view showing a basic structure of a self assembly monolayer for a microlens according an embodiment of the present invention. In addition, FIG. 4 is a picture showing an ink droplet for a microlens according to an embodiment of the present invention and FIG. 5 is a graph showing a cross-sectional profile posterior to a drying step of an ink droplet including first and second solvents having first and second boiling points, respectively, different from each other for a microlens according to an embodiment of the present invention.

In FIG. 2A, a self assembly monolayer (SAM) 120 having a high hydrophobicity is formed on a whole transparent substrate 110 such as a glass substrate by coating a SAM precursor (not shown) having a high hydrophobicity. For example, the SAM precursor may include an alkyl siloxane material such as octa decyle trichloro silane (OTS), octa dodecyle trichloro silane (ODTS) and octa decyle trimethoxy silane (OTMS). In addition, the SAM precursor may be coated through a coating method such as a spin coating, a slit coating, a dip coating, a spray coating and a contact printing.

As shown in FIG. 3, the self assembly monolayer 120 includes a head group HG, a main chain group MCG and an end group EG. The head group HG includes a functional group capable of combining with a surface of an object material layer and the main chain group MCG has an elongated structure. In addition, the end group EG connected to an end of the main chain group MCG includes a functional group capable of providing a functionality.

For example, when the substrate 110 is formed of a glass, the head group HG may include a silane group (—Si) for improving adhesion between the self assembly monolayer 120 and the substrate 110. In addition, the main chain group MCG may includes carbon (C) and the end group EG may include a group having a hydrophobicity. As a result, the self assembly monolayer 120 formed using the SAM precursor has a high hydrophobicity at a surface thereof due to the hydrophobic group of the end group EG.

In FIG. 2B, a plurality of ink droplets 130 having a hydrophilicity are formed on the self assembly monolayer 120 having a high hydrophobicity by separately jetting a transparent ink 125 having a hydrophilicity using an inkjet apparatus 190. A refractive index of the ink 125 is equal to or greater than a refractive index of the substrate 110. For example, the substrate 110 of a glass may have a refractive index of about 1.5 and the ink 125 may have a refractive index (n) equal to or greater than about 1.5 (n≥1.5). In addition, the ink 125 may include a solution having silicon oxide (SiOx) precursor as a solid material and the SiOx precursor may include silicon oxide (SiOx) as a main ingredient. The SiOx precursor for the ink 125 may have one of a nano particle shape and a molecular shape, and the SiOx precursor of a molecular shape may include one of tetraethoxysilane (TEOS) and tetrabutoxysilane (TBOS).

Further, the transparent ink 125 having a hydrophilicity may include the SiOx precursor including silicon oxide (SiOx) as a main ingredient and a solvent dispersing the SiOx precursor, and the solvent may include a first solvent having a first boiling point and a second solvent having a second boiling point lower than the first boiling point. A profile of a microlens 140 (of FIG. 2C) finally formed on the substrate 110 is determined by controlling concentrations of the first and second solvents as a dispersant of the ink 125.

The plurality of ink droplets 130 having a hydrophilicity are formed on the self assembly monolayer 120 having a high hydrophobicity to have a relatively great contact angle (i.e., a relatively great wetting angle) and a relatively small contact area.

As shown in FIG. 4, when an ink droplet 130 having a hydrophilicity is formed on the self assembly monolayer 120 having a high hydrophobicity and a comparison ink droplet 132 is formed on the substrate 110 such as a glass, a first contact angle a1 of the ink droplet 130 is greater than a second contact angle a2 of the comparison ink droplet 132. As a result, the ink droplet 130 has a shape similar to a sphere such that a cross-sectional area increases and decreases from a bottom to a top thereof and the comparison ink droplet 132 has a shape similar to a hemisphere such that a cross-sectional area decreases from a bottom to a top thereof. For example, the ink droplet 130 may have a truncated spherical shape where a portion smaller than a half volume of a whole sphere is eliminated and the comparison ink droplet 132 may have a truncated spherical shape where a portion greater than a half volume of a whole sphere is eliminated.

A size of the first ink droplet 130 may be determined by a discharge quantity of an ink from the inkjet apparatus 190. For example, the first ink droplet 130 may be formed by controlling a discharge quantity of an ink from to have a diameter of about several hundreds nano meters to about several tens micro meters (about 100 nm to about 99 μm).

In FIG. 2C, after the substrate 110 having the plurality of ink droplets 130 (of FIG. 2B) is kept under a room temperature for about several minutes to about several tens minutes (about 1 min. to about 99 min.) so that the whole solvent in the plurality of ink droplets 130 can be evaporated (a natural drying step), the substrate 110 having the plurality of ink droplets 130 is heated in a heat treatment apparatus 192 under a temperature of about 50° C. to about 350° C. for several tens seconds to about several tens minutes (about 10 sec. to about 99 min.) (a hardening step) so that the plurality of ink droplets 130 can be hardened to become a plurality of microlenses 140.

In another embodiment, a natural drying step for the plurality of ink droplets 130 may be omitted and a drying and hardening step may be performed by heating the plurality of ink droplets 130 in a heat treatment apparatus to form a plurality of microlenses.

While the ink droplet 130 is dried, an evaporated quantity of the solvent is greatest at a perimeter of the ink droplet 130 and decreases toward a center of the ink droplet 130 according to a gradient in temperature. As a result, a flow of the solvent from the center to the perimeter is generated in the ink droplet 130 to form a ring shape like a coffee stain, which is referred to as a coffee ring effect.

In the embodiment of the present invention, the first and second solvents having first and second boiling points, respectively, different from each other, are used as a dispersant for the SiOx precursor so that a profile of the ink droplet 130 can be controlled by using the coffee ring effect.

As shown in FIG. 5, as a first concentration of the first solvent having a first boiling point (a relatively higher boiling point) of about 245° C. relatively increases, a thickness of the center of the droplet 130 (of FIG. 2C) increases as compared with a thickness of the perimeter of the droplet 130 so that the droplet 130 can have a convex lens shape. In addition, as a second concentration of the second solvent having a second boiling point (a relatively lower boiling point) of about 200° C. relatively increases, the thickness of the center of the droplet 130 (of FIG. 2C) decreases as compared with the thickness of the perimeter of the droplet 130 so that the droplet 130 can have a concave lens shape.

Accordingly, the profile posterior to a drying step of the ink droplet 130 may be controlled by a concentration ratio of the first and second solvents. For example, the ink droplet 130 may be formed to have a convex lens shape, where a thickness at the center thereof is greater than a thickness at the perimeter thereof with respect to the self assembly monolayer 120, by increasing the concentration ratio of the first solvent having the first boiling point (the relatively higher boiling point), and the ink droplet 130 may be formed to have a concave lens shape, where a thickness at the center is smaller than a thickness at the perimeter with respect to the self assembly monolayer 120, by increasing the concentration ratio of the second solvent having the second boiling point (the relatively lower boiling point). As a result, one of the convex lens shape and the concave lens shape of the ink droplet 130 may be selectively obtained by controlling the concentration ratio of the first and second solvents.

When the droplet 130 has a concave lens shape having an ideal spherical concave portion or a convex lens shape having an ideal spherical convex portion, a light collecting efficiency and a length of a light path due to inner total reflection are maximized. For example, when the first concentration of the first solvent having the first boiling point of about 245° C. is within a range of about 0% to about 10% (a concentration ratio of the first solvent to the second solvent is between 100%:0%~90%:10%) or the second concentration of the second solvent having the second boiling point of about 200° C. is within a range of about 0% to about 10% (a concentration of the first solvent to the second solvent is between 0%:100%~10%:90%), the droplet 130 having an excellent light collecting efficiency may be obtained.

Figure 6:
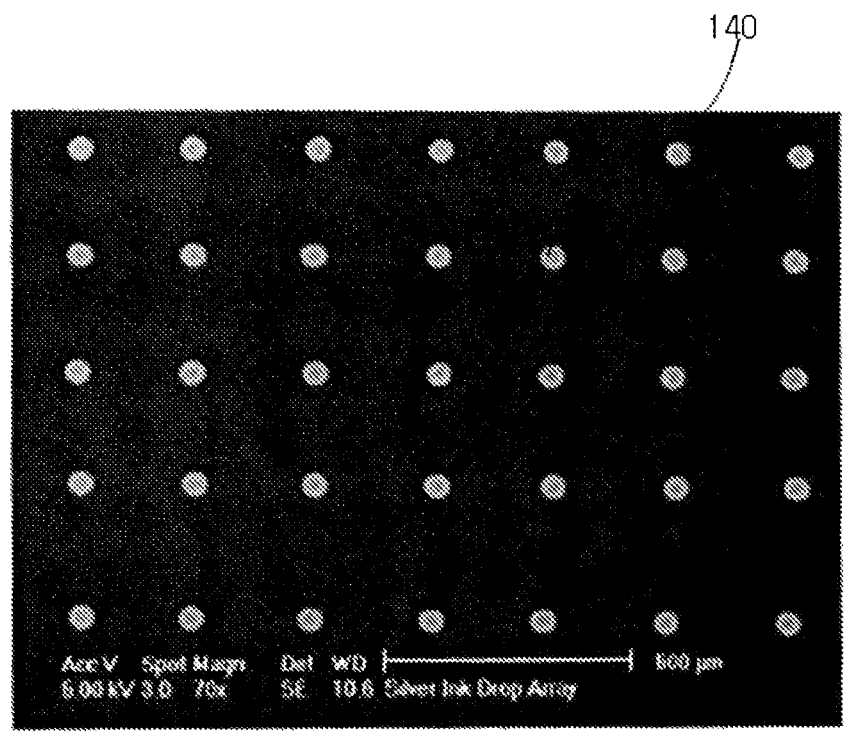
FIG. 6 is a picture showing a plurality of microlenses according to an embodiment of the present invention.

FIG. 6 is a picture showing a plurality of microlenses according to an embodiment of the present invention.

As shown in FIG. 6, a plurality of microlenses 140 having the same size as each other are spaced apart from each other by an equal distance therebetween after the hardening step.

Figure 7:
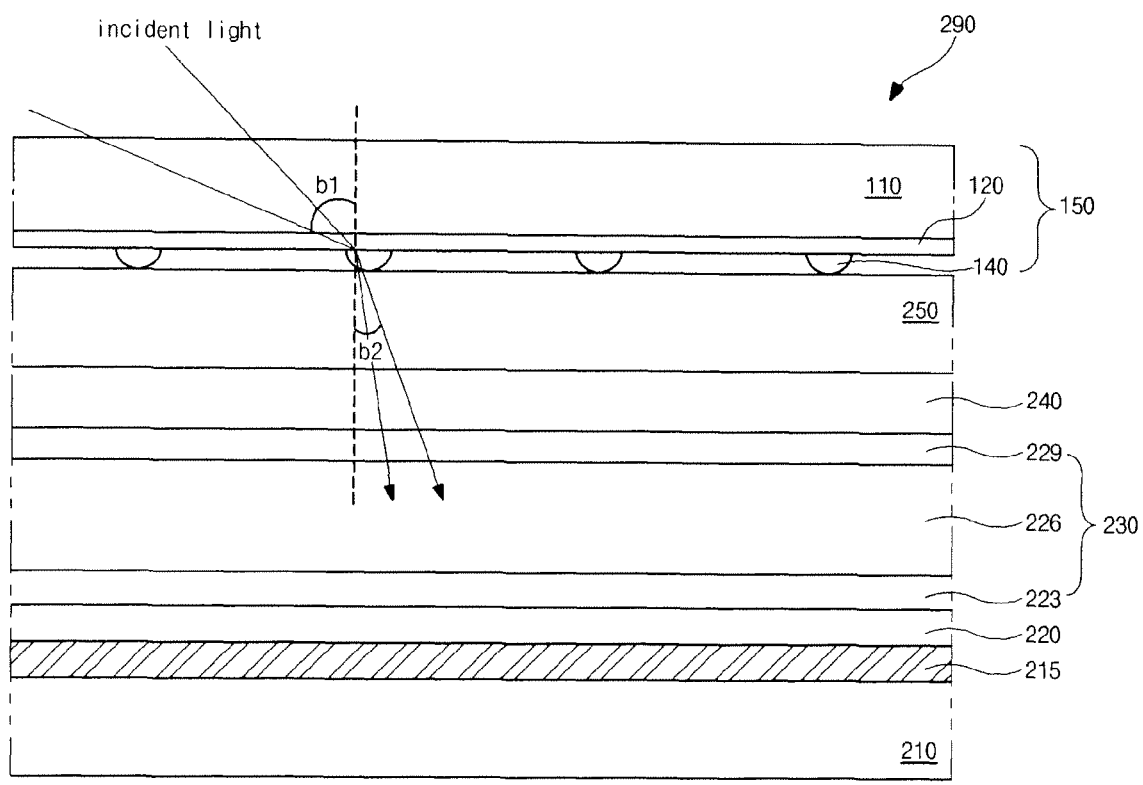
FIG. 7 is a cross-sectional view showing a solar cell including a microlens as a light collecting means according to an embodiment of the present invention.

FIG. 7 is a cross-sectional view showing a solar cell including a microlens as a light collecting means according to an embodiment of the present invention.

In FIG. 7, a solar cell 290 includes a reflective layer 215, a first transparent electrode 220, a positive-intrinsic-negative (PIN) junction semiconductor layer 230, a second transparent electrode 240 and a light collecting means 150. The reflective layer 215 of a material having a relatively high reflectance is formed on a first substrate 210. The reflective layer 215 may include a metallic material or a conductive material. Although the reflective layer 215 is formed on an inner surface of the first substrate 210 in FIG. 7, the reflective layer 215 may be formed on an outer surface of the first substrate 210 in another embodiment.

The first transparent electrode 220 is formed on the reflective layer 215 and the PIN junction semiconductor layer 230 is formed on the first transparent electrode 220. The first transparent electrode 220 may include a transparent conductive oxide such as a gallium-zinc-oxide (GZO), aluminum-zinc-oxide (AZO), zinc-oxide (ZnO) and tin-oxide (SnO). The P/I/N junction semiconductor layer 230 includes a negative (N) type semiconductor layer 223 on the first transparent electrode 220, an intrinsic semiconductor layer 226 on the N type semiconductor layer 223 and a positive (P) type semiconductor layer 229 on the intrinsic semiconductor layer 226. The N type and P type semiconductor layers 223 and 229 may include silicon doped with N type and P type impurities, respectively, and the intrinsic semiconductor layer 226 may include hydrogenated amorphous silicon (a-Si:H).

Although the single PIN junction semiconductor layer 230 is formed on the first transparent electrode 220 in FIG. 7, a plurality of PIN junction semiconductor layers having different band gap energies may be laminated on the first transparent electrode 220 for absorbing light having various wavelength bands effectively in another embodiment. For example, a plurality of PIN junction semiconductor layers may be formed on the first transparent electrode 220 such that the band gap energies of the plurality of PIN junction semiconductor layers gradually increase from an uppermost PIN junction semiconductor layer to a lowermost PIN junction semiconductor layer.

In addition, when the single PIN junction semiconductor layer 230 is formed on the first transparent electrode 220, the intrinsic semiconductor layer 226 may be omitted such that a positive-negative (PN) junction semiconductor layer including an N type semiconductor layer and a P type semiconductor layer is used instead of the PIN junction semiconductor layer 230.

The second transparent electrode 240 is formed on the PIN junction semiconductor layer 230 and a second substrate 250 for protecting the PIN junction semiconductor layer 230 and the second transparent electrode 240 is formed on the second transparent electrode 240. The second transparent electrode 240 may include a transparent conductive oxide such as a gallium-zinc-oxide (GZO), aluminum-zinc-oxide (AZO), zinc-oxide (ZnO) and tin-oxide (SnO). The second substrate 250 may include a transparent material.

The light collecting means 150 including a third substrate 110, a self assembly monolayer 120 on the third substrate 110 and a plurality of microlenses 140 on the self assembly monolayer 120 is formed on the second substrate 250. For example, the light collecting means 150 may be formed on the second substrate 250 such that the plurality of microlenses 140 contact the second substrate 250. In addition, the light collecting means 150 may be formed through a process shown in FIGS. 2A to 2C. The second substrate 250 may be omitted such that the light collecting means 250 is formed directly on the second transparent electrode 240 and the plurality of microlenses 140 contact the second transparent electrode 240 in another embodiment.

A top surface of each of the first transparent electrode 220 and the PIN junction semiconductor layer 230 may have an unevenness to improve an absorption rate of light in another embodiment. When each of the first transparent electrode 220 and the PIN junction semiconductor layer 230 has the uneven top surface, since the incident light is scattered at the top surface, the light path is elongated. As a result, the PIN semiconductor layer 230 absorbs more light and the photoelectric efficiency is improved.

In the solar cell 290, electrons and holes asymmetrically exist in the PIN junction semiconductor layer 230 or the PN junction semiconductor layer for photovoltaic energy conversion. In the PIN junction semiconductor layer 230 or the PN junction semiconductor layer, for example, the N type semiconductor layer 223 has a relatively high electron density and a relatively low hole density and the P type semiconductor layer 229 has a relatively low electron density and a relatively high hole density. As a result, imbalance of charges is generated in the PIN junction semiconductor layer 230 or the PN junction semiconductor layer in a thermal equilibrium state due to diffusion by a gradient in concentration of carriers. In addition, an electric field (built in potential) is generated by the imbalance of charges and the diffusion of carriers is stopped by the electric field.

When a light having an energy greater than the band gap energy, which is a difference between a conduction band energy and a valence band energy of the semiconductor material, of the PIN junction semiconductor layer 230 or the PN junction semiconductor layer is irradiated, the electrons are excited from the valence band to the conduction band and the holes corresponding to the excited electrons are generated in the valence band. The excited electrons become free electrons that freely move in the conduction band.

The free electrons and the holes are referred to as excess carriers and the excess carriers are diffused in the valence band or the conduction band due to the difference in concentration. The excess carriers such as the electrons excited in the P type semiconductor layer 229 and the holes generated in the N type semiconductor layer 223 may be defined as a minority carrier, while the holes in the P type semiconductor layer 229 and the electrons in the N type semiconductor layer 223 before junction may be defined as a majority carrier. Although the flow of the majority carrier is restricted by an energy barrier due to the electric field, the electrons as the minority carrier in the P type semiconductor layer 229 move to the N type semiconductor layer 223. As a result, a potential difference, i.e., an electromotive force (emf), is generated between the two opposite ends of the PIN junction semiconductor layer 230 or the PN junction semiconductor layer due to the diffusion of the minority carrier. When the first and second transparent electrodes 220 and 240 contacting the two opposite ends, respectively, of the PIN junction semiconductor layer 230 or the PN junction semiconductor layer are connected to an external circuit, the solar cell 290 functions as a battery due to the electromotive force.

The efficiency of photoelectric conversion of the solar cell 290 is improved by collecting the incident light. Accordingly, the light collecting means 150 including a plurality of microlenses 140 spaced apart from each other is formed on an outer surface of the second transparent electrode 240. In the solar cell 290 including the light collecting means 150, since the intensity of the light transmitted into the PIN junction semiconductor layer 230 increases due to scattering at the plurality of microlenses 140 of the light collecting means 150 regardless of an incident angle of the light, the efficiency of converting the light energy to the electric energy is improved. For example, when the light inputted into the solar cell 290 has an incident angle b1 of about 70° with respect to a normal line, the light is refracted by the plurality of microlenses 140 to be outputted with a refraction angle b2 smaller than the incident angle b1. As a result, the light is inputted into the PIN junction semiconductor layer 230 with an angle smaller than about 70° and an absorption rate of light in the PIN junction semiconductor layer 230 is improved. Moreover, the light which is not inputted into the PIN junction semiconductor layer 230 in the solar cell without the plurality of microlenses may be inputted into the PIN junction semiconductor layer 230 due to the refraction at the plurality of microlenses 140.

In a solar cell including a microlens and a method of fabricating the solar cell according to the present invention, consequently, since a microlens is fabricated through a simplified process including a step of forming a self assembly monolayer having a strong hydrophobicity, a step of forming a ink droplet having a hydrophilicity on the self assembly monolayer and a step of drying the ink droplet, a fabrication time and a fabrication cost are reduced and a productivity is improved. In addition, since a light collecting efficiency of a solar cell increases due to a microlens, the solar cell including the microlens fabricated through the method according to the present invention has an improved photoelectric efficiency.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A solar cell, comprising:
   a first substrate;
   a first transparent electrode on the first substrate;
   a first positive-intrinsic-negative (PIN) junction semiconductor layer on the first transparent electrode, wherein the first PIN junction semiconductor layer includes a negative (N) type semiconductor layer on the first transparent electrode, an intrinsic semiconductor layer on the N type semiconductor layer and a positive (P) type semiconductor layer on the intrinsic semiconductor layer, and wherein the N type and P type semiconductor layers include silicon doped with N type and P type impurities, respectively, and the intrinsic semiconductor layer includes hydrogenated silicon;
   a second transparent electrode on the first PIN junction semiconductor layer;
   a second substrate directly on an entire surface of the second transparent electrode; and
   a light collecting means on the second substrate and second transparent electrode,
   wherein the light collecting means includes a self assembly monolayer having at least one hydrophobic portion directly contacting an entire surface of a third substrate, and a plurality of hydrophilic microlenses directly on the self assembly monolayer, wherein the self assembly monolayer and the plurality of hydrophilic microlenses are between the second substrate and the third substrate, and
   wherein the plurality of hydrophilic microlenses include a plurality of hardened ink droplets.

2. The solar cell according to claim 1, further comprising a second PIN junction semiconductor layer under the first PIN junction semiconductor layer and a third PIN junction semiconductor layer under the second PIN junction semiconductor layer, wherein the first to third PIN junction semiconductor layers have the same structure as one another.

3. The solar cell according to claim 2, wherein band gap energies of the first to third PIN junction semiconductor layers gradually increase from the first PIN junction semiconductor layer to the third PIN junction semiconductor layer.

4. The solar cell according to claim 1, wherein the plurality of hardened ink droplets comprise silicon oxide (SiOx) solid material.

5. The solar cell according to claim 1, wherein a light inputted into the solar cell with an incident angle is refracted by the plurality of hydrophilic microlenses to be outputted with a refraction angle smaller than the incident angle.

6. The solar cell according to claim 1, wherein the self assembly monolayer includes a head group, a main chain group and a hydrophobic end group.

7. The solar cell according to claim 1, wherein each of the plurality of ink droplets has a truncated spherical shape where a portion smaller than a half volume of the whole sphere is eliminated.

* * * * *